United States Patent
Zhang et al.

[11] Patent Number: 5,909,119
[45] Date of Patent: Jun. 1, 1999

[54] METHOD AND APPARATUS FOR PROVIDING SEPARATE FAT AND WATER MRI IMAGES IN A SINGLE ACQUISITION SCAN

[75] Inventors: Weiguo Zhang, Foster City; David M. Kramer, Tiburon; David M. Goldhaber, Berkeley; Ching Yao, San Carlos; Hsu Chang, Fremont, all of Calif.

[73] Assignee: Toshiba America MRI, Inc., Tustin, Calif.

[21] Appl. No.: 08/768,993

[22] Filed: Dec. 18, 1996

Related U.S. Application Data

[63] Continuation-in-part of application No. 08/516,539, Aug. 18, 1995, abandoned, and a continuation-in-part of application No. 08/754,710, Dec. 12, 1996, abandoned.

[51] Int. Cl.$^6$ ........................................... G01N 3/00
[52] U.S. Cl. .................................... 324/309; 324/307
[58] Field of Search .............................. 324/309, 307, 324/306, 312, 314, 300

[56] References Cited

U.S. PATENT DOCUMENTS

| | | | |
|---|---|---|---|
| 4,746,864 | 5/1988 | Satoh | 324/309 |
| 4,818,941 | 4/1989 | McKinnon | 324/309 |
| 5,051,699 | 9/1991 | Hanawa et al. | 324/309 |
| 5,078,141 | 1/1992 | Suzuki et al. | 128/653.2 |
| 5,125,407 | 6/1992 | Harms et al. | 128/653.2 |
| 5,134,372 | 7/1992 | Inoue | 324/309 |
| 5,229,717 | 7/1993 | Hinks | 324/309 |
| 5,250,899 | 10/1993 | Listerud et al. | 324/309 |
| 5,270,654 | 12/1993 | Feinberg et al. | 324/309 |
| 5,615,676 | 4/1997 | Khono | 324/309 |
| 5,627,469 | 5/1997 | Hong et al. | 324/309 |

FOREIGN PATENT DOCUMENTS

| | | |
|---|---|---|
| 0318212 | 5/1989 | European Pat. Off. . |
| 0 745 865 A1 | 12/1996 | European Pat. Off. . |
| 2304419 | 3/1997 | United Kingdom . |
| WO 91/02263 | 2/1991 | WIPO . |

OTHER PUBLICATIONS

Glover et al., Three–Point Dixon Technique for True Water/Fat Decomposition with B$_o$ Inhomogeneity Correction, Magnetic Resonance in Medicin 18, pp. 371–383 (1991).

Williams et al, "True Water and Fat MR Imaging with Use of Multiple–Echo Acquisition", Medical Physics, Radiology 173, pp. 249–253 (1989).

Yeung et al, "Separation of True Fat and Water Images by Correcting Magnetic Field Inhomogeneity in Situ", Radiology 159, pp. 783–786 (1986).

(List continued on next page.)

*Primary Examiner*—Louis Arana
*Attorney, Agent, or Firm*—Nixon & Vanderhye P.C.

[57] ABSTRACT

A method and apparatus for obtaining three MRI image data in a single data acquisition TR interval for use in constructing separate water and fat images by appropriate processing of the three images data is disclosed. The three image data are obtained in one exemplary embodiment by sandwiching a spin echo between two field echoes. The invention can also be used for multiple-echo and multiple-slice 3D scans.

28 Claims, 8 Drawing Sheets

OTHER PUBLICATIONS

Hennig et al, "Rare Imaging: A Fast Imaging Method for Clinical MR", Magnetic Resonance in Medicine 3, pp. 823–833 (1986).

Zhang et al, "Separation of Water and Fat Images at 0.35 Tesla Using the Three–Point Dixon Method with "Sandwich" Echoes", Abstract, Society of Magetic Resonance Third Scientific Meeting, Nice, France, Aug. 19–25, 1995.

Sumanaweera, "MR Susceptibility Misregistration Correction", IEEE Transaction on Medical Imaging, vol. 12, No. 2, Jun. 1993, pp. 251–259.

Szumowski et al, "Phase Unwrapping in the Three–Point Dixon Method for Fat Suppression MR Imaging", Magnetic Resonance Imaging, Radiology 1994, 192:555–561.

Hardy et al, "Separation of Fat and Water in Fast Spin–Echo MR Imaging with the Three–Point Dixon Technique", J. Magn. Reson, Imaging, 5, pp. 181–185, 1995.

Xiang et al, "General 3–Point Water–Fat Imaging with Optimized SNR", IVth ISMRM, p. 1544 (1996).

Szumowski et al, "Double–Echo Three–Point Dixon Method for Fat Suppression MRI", Magn. Reson, Med., 34, pp. 120–124 (1995)., JP 040079 938, Toshiba, See Figure 3 and Patent Abstracts of Japan Section C, Section 957, vol. 16, No. 295, Jun. 30, 1992, p. 102.

METHOD AND APPARATUS FOR PROVIDING SEPARATE FAT AND WATER MRI IMAGES IN A SINGLE ACQUISITION SCAN

RELATED APPLICATIONS

This application is a continuation-in-part of earlier commonly-assigned, now abandoned, application Ser. No. 08/516,539, filed Aug. 18, 1995, naming Messrs. Zhang, Kramer and Goldhaber as inventors. The entirety of this related application is hereby incorporated by reference. This application is also a continuation-in-part of earlier, commonly assigned, now abandoned, application Ser. No. 08/754,710, filed Dec. 12, 1996, naming messrs. Zhang, Kramer and Goldhaber as inventors.

FIELD OF THE INVENTION

This invention relates generally to the field of magnetic resonance (MR) imaging (MRI) utilizing NMR phenomena. It is particularly related to a method and apparatus for obtaining MRI image data that can be used to separate MRI images into water and fat components, even when field inhomogeneities are present.

BACKGROUND OF THE INVENTION

MRI systems use the nuclear magnetic resonance (NMR) effects that RF transmissions at the nuclei Lamor frequency have on atomic nuclei having a net magnetic moment such as those in hydrogen. The net magnetic moment of these nuclei are first magnetically aligned by a strong static magnetic field $B_0$ (e.g., typically created by magnetic poles on opposite sides of the MRI imaging volume or inside a solenoidal cryogenic superconducting electromagnet). The static field $B_0$ is altered by gradient magnetic fields created in the X, Y, and Z directions of the imaging volume. Selected nuclei, which spin in alignment with the $B_0$ field, are then nutated by the perpendicular magnetic field of a NMR RF transmission at the Lamor frequency, causing a population of such nuclei to tip from the direction of the magnetic field $B_0$. Thus, for example, in FIG. 1, certain nuclei (designated by magnetic moment $M_0$) are aligned with the "Z'" axis by the static $B_0$ field and then rotated to the X'–Y' plane as a result of an RF signal being imposed on them. The nuclei then precess in the X'–Y' plane as shown by the circulating arrow in FIG. 1 (which is a reference frame rotating at the nominal Lamor resonance frequency around the Z' axis).

The NMR RF spin-nutating signal will, of course, tip more than one species of the target isotope in a particular area. Immediately after the nutating RF signal tips them, the spinning nuclei will all be in-phase with each other; that is, the rotating magnetic moments of all NMR species all rotate across the "Y'" axis all at approximately the same time. However, after the NMR nutating RF pulse ends, each species of nuclei begin to freely precess at its own characteristic speed around the Z' axis. As they do, the phase of the rotating nuclei species will differ as a result of such parameters as the physical or chemical environment that the nuclei are located in. Nuclei in fat, for example, precess at a different rate than do nuclei in water. In an MRI imaging pulse sequence there are also magnetic field gradients which dephase the moments due to their local resonance frequency varying in space.

Once the spins are disturbed from their equilibrium, processes known as relaxation cause the phase-coherent component of magnetic moments in the X'–Y' plane to decay and the Z'-component to recover to its equilibrium magnitude, $M_0$. These processes are usually characterized by exponentials whose time constants are called $T_2$ and $T_1$, respectively. When magnetic resonance signals are observed through flux oscillation in a plane coexistent with the X'–Y' plane, both of these processes decrease the signal strength as a function of time.

As a result, if the relative phase of components of the magnetic moments in the X'–Y' plane of FIG. 1 begin aligned on the Y'-axis, over time they will begin to spread out and disperse to fill the full rotational area. The nuclei of moment $M_2$, for example, which initially crossed the Y'-axis at the same time as $M_0$, gradually moves during the relaxation period to the position shown in FIG. 1 as it spins faster than $M_0$. $M_1$, by contrast, spins slower than both $M_0$ and $M_2$, and thus begins to lag them during the dephasing period. The strength of the detectable NMR response signal thus decays as the relative phases of the magnetic moments disperse (i.e., lose phase coherence) in the X'–Y' plane.

Information about NMR hydrogen nuclei can be obtained, in part, by measuring their $T_2$, $T_1$ decay times. In addition, before the nuclei become completely dephased another RF signal (e.g., a 180° signal) can tip the magnetic moments (e.g., to a 180° inverted position). This inverts the spinning magnetic moments $M_0$, $M_1$ and $M_2$ so the fastest moment $M_2$ now lags (instead of leading) $M_0$, which in turn also now lags the slowest moment $M_1$. Eventually, the faster moment $M_2$ will again catch up with and pass the slowest moment $M_1$ during which, a so-called "spin-echo" NMR RF response can be detected from the changes in net magnetic moment as the various magnetic moments come back into phase coherence. The whole procedure must, of course, be completed before $T_1$ or $T_2$ relaxation processes destroy the detectable X'–Y' components of the magnetic moments.

Detectable NMR RF response echoes can also be formed by application of a field gradient and it's subsequent reversal, provided that it is done before $T_1$ or $T_2$ relaxation destroy $M_{X'Y'}$. This is commonly called a field echo, gradient echo or race-track echo.

The above are just two background examples of how the nuclei can be tipped, relaxed, brought in- or out-of-phase, etc. from which information about the nuclei can be obtained by observing detectable NMR RF response signals.

The differences in the phase relationships between the species of nuclei in one tissue versus another can be used as information to separate MRI images of fat components of tissue from fluids or water-based tissue (for these purposes, "water-based tissue" and "fluids" are used interchangeably).

Although MR images of both water and fat may contain the same or different diagnostic information, they often interfere with each other's interpretation when overlapped in an MRI image and thus make it difficult to properly interpret the composite MR image. Somewhat different diagnostic information may also be obtained from separate MR images of only the fat-based or water-based species of NMR nuclei.

At high field strengths, the separation of water and fat images or suppression of fat signals can be achieved using selective excitation or non-excitation approaches. However, at mid- or low field strengths, approaches based on chemical shift selectivity become impractical, if not impossible. At all field strengths, the difficulties of water/fat image separation are further exacerbated when there are large magnetic field inhomogeneities.

This difficulty in separating fat and water images in a practical MR imaging application is particularly true for mid- and low-field systems where the frequency separation between the water and fat signals is much reduced in comparison to that at high fields. Recently, several techniques were introduced for separation of water and fat images in the presence of large field inhomogeneities. Some of these techniques use multiple spin-echoes, thus requiring the use of multiple RF refocusing pulses. They are therefore sensitive to magnetic field inhomogeneities and also preclude multiple-echo experiments. The Three-Point Dixon method has promising features for mid- or low field applications. It uses a single spin-echo sequence but relies on the acquisition of three images for water/fat separation, an in-phase image and two out-phase images. Unfortunately, it requires a minimum of three scans to do so.

FIG. 2 shows the three data acquisition schemes for the three images in the Three-Point Dixon method. Slice selection is not shown for simplicity. As those in the art will understand from FIG. 2, three different scans are used. In the first, a 90° pulse is followed by a 180° pulse at a time T, yielding the spin echo $S_0$. Then, a 90° pulse is followed by a 180° pulse a time $\tau$ earlier than the time T, yielding a spin echo $S_\pi$. Finally, another 90° pulse is followed by a 180° pulse a time $\tau$ later than the time T, yielding a spin echo $S_{-\pi}$. The Dixon Methodology is described in "*Three-Point Dixon Technique for True Water Fat Decompositions with $B_0$ Inhomogeneity Corrected,*"18 Magnetic Resonance in Medicine, 371–383 (1991), by Glover et al., "*True Water and Fat MR Imaging With Use of Multiple-Echo Acquisition*", 173 Radiology 249–253 (1989), by Williams et al., "*Separation of True Fat and Water Images By Correcting Magnetic Field Inhomogeneity In Situ,*" 159 Radiology 783–786 (1986), by Yeung et al., which are incorporated herein by reference, and are summarized in part below.

The value of $\tau$ is determined according to $\tau=1/(4\Delta\nu)$ with $\Delta\nu$ being the frequency difference between the water and fat signals. The value of $\tau$ is thus chosen so the phase between the nuclei in, respectively, fat and water are 1) in-phase, 2) out-of-phase by $\pi$, and 3) out-of-phase by $-\pi$. FIGS. 3*a*, 3*b* and 3*c* schematically show in a rotating frame the MR signals in the three different acquisition schemes.

Other phase differences than $\pi$ can also be used as described in Hardy et al., *JMRI*, 1995. Additionally, the $S_0$ signal could be derived from a gradient reversal induced field echo. It is not required that $S_0$ be an RF induced spin echo.

In a brief summary, three NMR RF responses are required to compute separate water-based and fat-based images:

$S_0$=a first NMR response with phase coherent fat and water NMR species;

$S_\Theta$=a second NMR response with a predetermined difference between fat and water NMR species in a first (e.g., "positive") direction; and $S_{-\Theta}$=a third NMR response with the same predetermined phase difference between fat and water NMR species in the opposite (e.g., "negative") direction.

Once $S_0$, $S_\Theta$, $S_{-\Theta}$ and $\Theta$ are known, then separate MR images of the NMR fat species and/or the NMR water species can be derived. The following more specific description of an exemplary embodiment is based on the $\Theta=\pi$ example detailed in the Dixon paper.

In the presence of field inhomogeneities, the MR signals can be described by $$S_0=(P_w+P_f)$$

$$S_\pi=(P_w-P_f)e^{i\phi}$$

$$S_{-\pi}=(P_w-P_f)e^{-i\phi}$$

where $\phi$ is the phase angle due to field inhomogeneities or frequency offset, and $P_w$ and $P_f$ are water and fat spin densities, respectively.

Thus $\phi$ can be determined from $S_\pi$ and $S_{-\pi}$ by $$\phi=\tfrac{1}{2}arg(S_\pi \cdot S^*_{-\pi})$$

where arg produces the phase angle of a complex number.

Water and fat images can then be reconstructed according to $$I_{water}=S_0+0.5S_\pi e^{-i\phi}+0.5S_{-\pi}e^{i\phi}$$

$$I_{fat}=S_0-0.5S_\pi e^{-i\phi}-0.5S_{-\pi}e^{i\phi}$$

The central component of this method—and also the most demanding component to determine—is the phase angle $\phi$. The phase angle is generally determined by phase mapping. Calculating $\phi$ from $S_\pi$ and $S_{-\pi}$ involves:

1) fitting the phase derivatives to polynomial functions; and 2) phase unwrapping.

Each of these are discussed in turn below.

i. Polynomial fitting

The magnetic field is modeled using a polynomial function:

$$B(x, y) = \sum_{n=1}^{3} [a_n(x-x_o)^n + b_n(y-y_o)^n] + c_o$$

To find the coefficients $a_n$ and $b_n$, partial spatial derivatives of the phase value $\phi$ are calculated and fit to the polynomial functions:

$$\frac{\partial \phi(x,y)}{\partial x} = p_3 x^2 + p_2 x + p_1$$

$$\frac{\partial \phi(x,y)}{\partial y} = q_3 y^2 + q_2 y + q_1$$

Fitting was performed with weighted least-square with the weighting factors determined according to $$w(x,y) = \left| \frac{S_0(x,y)}{S_{0\max}} \right|$$

where $S_0(x,y)$ is the pixel value in the in-phase image and $S_{0max}$ is the maximum of that image.

From $p_n$ and $q_n$, $a_n$ and $b_n$ are calculated from the equations:

$$\begin{cases} p_1 = a_1 - 2a_2 x_0 + 3a_3 x_0^2 \\ p_2 = 2a_2 - 6a_3 x_0 \\ p_3 = 3a_3 \end{cases}$$

-continued $$\begin{cases} q_1 = b_1 - 2b_2 y_0 + 3b_3 y_0^2 \\ q_2 = 2b_2 - 6b_3 y_0 \\ q_3 = 3b_3 \end{cases}$$

ii. Binary Phase Unwrapping

If it can be assumed that the magnetic field fitting is relatively accurate within a small error range, for example, ±0.2π, then unwrapping can be performed by simply comparing the measured phase φ with the predicted phase $\phi_p$:

$$\Delta\phi = \phi_p - \phi$$

If $|\Delta\phi| > \pi$, then $\phi_f$ used for water and fat image reconstruction is determined by $$\phi_f = \phi + \text{integer}\left(\frac{\Delta\phi}{2\pi}\right) \times 2\pi.$$

where integer truncates the resulting quotient to whole number.

iii. Unwrapping by Region Growing

However, the field fitting may contain large errors (for example, >π) which will cause errors in phase unwrapping and consequently result in water/fat mutual contamination in the final images. To unwrap in a more fool-proof way, a region growing algorithm was implemented as the following:

(A) A pixel in the image was chosen as the subseed for unwrapping and the measured phase value was assigned to the final phase value used for water and fat image reconstruction.

$$\phi_f(x_0,y_0) = \phi(x_0,y_0)$$

(B) From the subseed, a 4×4 seed was built by comparing the phase values to the subseed value. If the difference is larger than a predetermined threshold, a 2π unwrapping is executed:

$$\Delta\phi = \phi - \phi(x_0,y_0)$$

$$\phi_f = \phi + \text{sign}(\Delta\phi) \times 2\Pi$$

(C) Continuing from the seed, a four column cross is built using a single direction prediction:

$$\phi_p = 1/4 \{\phi_f^{-4} + \phi_f^{-3} + \phi_f^{-2} + \phi_f^{-1} + 4\delta\phi^{-1} + 3\delta\phi^{-2} + 2\delta\phi^{-3} + \delta\phi^{-4}\}$$

$$\Delta\phi = \phi - \phi_p$$

where $\phi_f^{-1}$ (i=1, . . . 4) are unwrapped phase values of the neighboring pixel, $\delta\phi^{-1}$ (i=1, . . . 4) are phase increments between two neighboring pixels from the polynomial fitting.

If the pixel value is smaller than the intensity threshold, $\phi_f$ is set to $\phi_p$. Otherwise, if $|\Delta\phi| < \pi$ set $\phi_f$ to $\phi$. If $|\Delta\phi| > \pi$ then $$\phi_f = \phi + \text{integer}(\delta\phi/2\pi) \times 2\pi.$$

(D) Using the cross, the four quadrants of the image are unwrapped using the same prediction approach, but in two directions. Unwrapping is executed when both directions show the same execution for unwrapping. In other situations, the average of the predicted values is used. When the pixel value is below the intensity threshold, the phase value is again set to the predicted average value.

See Szamowski et al., *Radiology* 192, page 555–561, 1994 for more discussion of region growing approaches to phase correction.

iv. Results

Shown in FIG. 4 are head images reconstructed with binary phase unwrapping. The left image of FIG. 4 is a water and fat image; the middle image is water only; and the right image is fat only. The corresponding images reconstructed using the region growing algorithms are shown in FIG. 5. FIGS. 6 and 7 show the abdominal images reconstructed in the same way as for FIGS. 3a–3c and FIG. 4, respectively.

As can be seen, this prior method obtains separate fat and water images but disadvantageously requires three separate data acquisition scans (e.g., 3 TR intervals) to obtain them.

SUMMARY OF THE INVENTION

The present invention provides method and apparatus which acquire all the information necessary for separating water and fat images using only a single data acquisition scan. During the scan, a single "sandwich" spin-echo/gradient field echo sequence is used in which a spin echo signal is sandwiched between two field echo signals (or vice-versa)—or other successive 3-NMR responses in a single data acquisition TR interval—to obtain the information necessary to solve the $I_{water}$ and $I_{fat}$ equations.

The invention is also capable of 3-D multiple-slice multiple-echo acquisition.

BRIEF DESCRIPTION OF THE DRAWINGS

The purpose and advantages gained by the present invention will be understood by careful study of the following detailed description of the presently preferred embodiment with particular reference to the accompanying drawings.

DETAILED DESCRIPTION OF THE PRESENTLY PREFERRED EMBODIMENT

Figure 1:
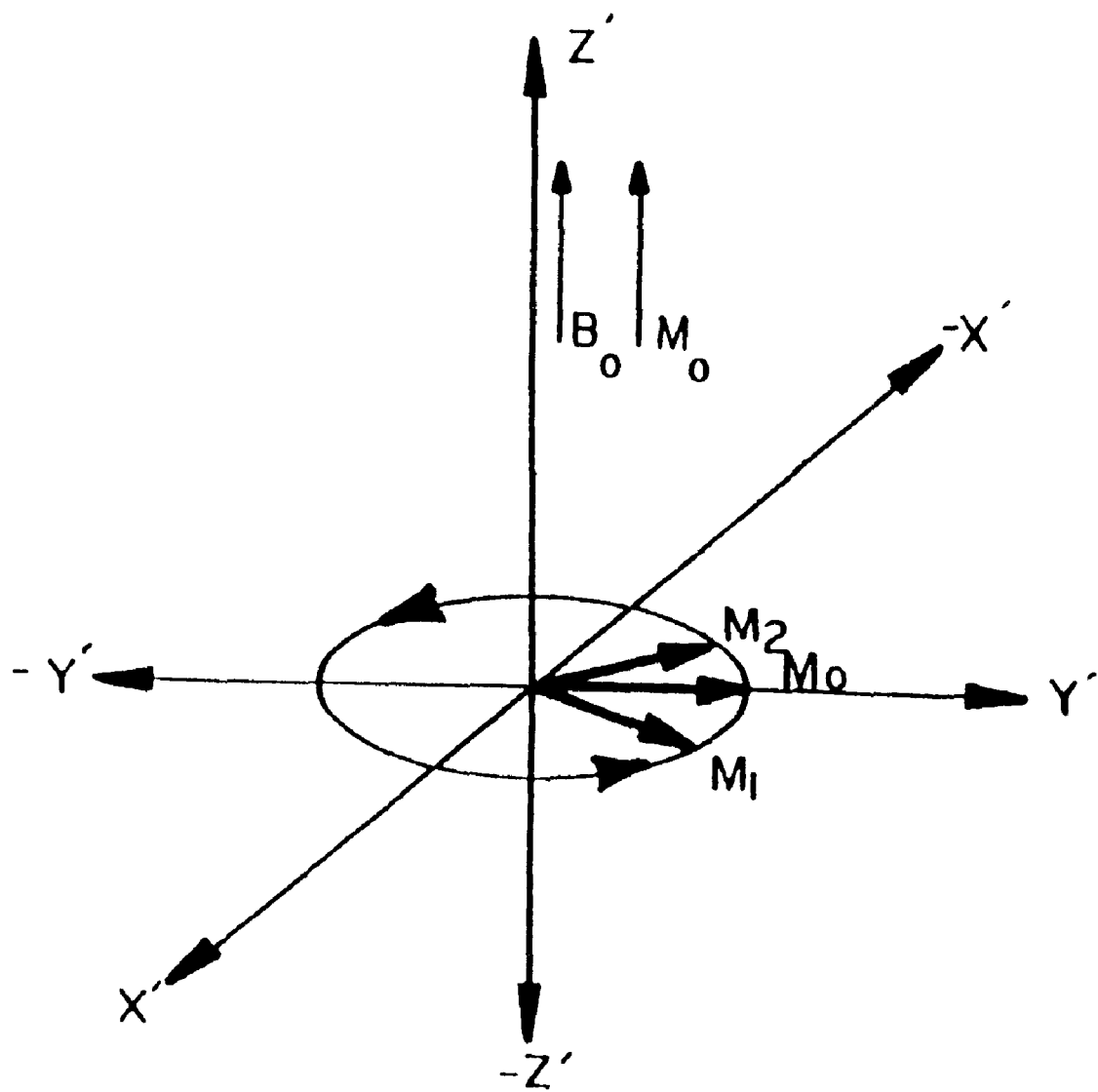
FIG. 1 is a schematic diagram of a typical rotating frame of MRI signals.
Figure 2:
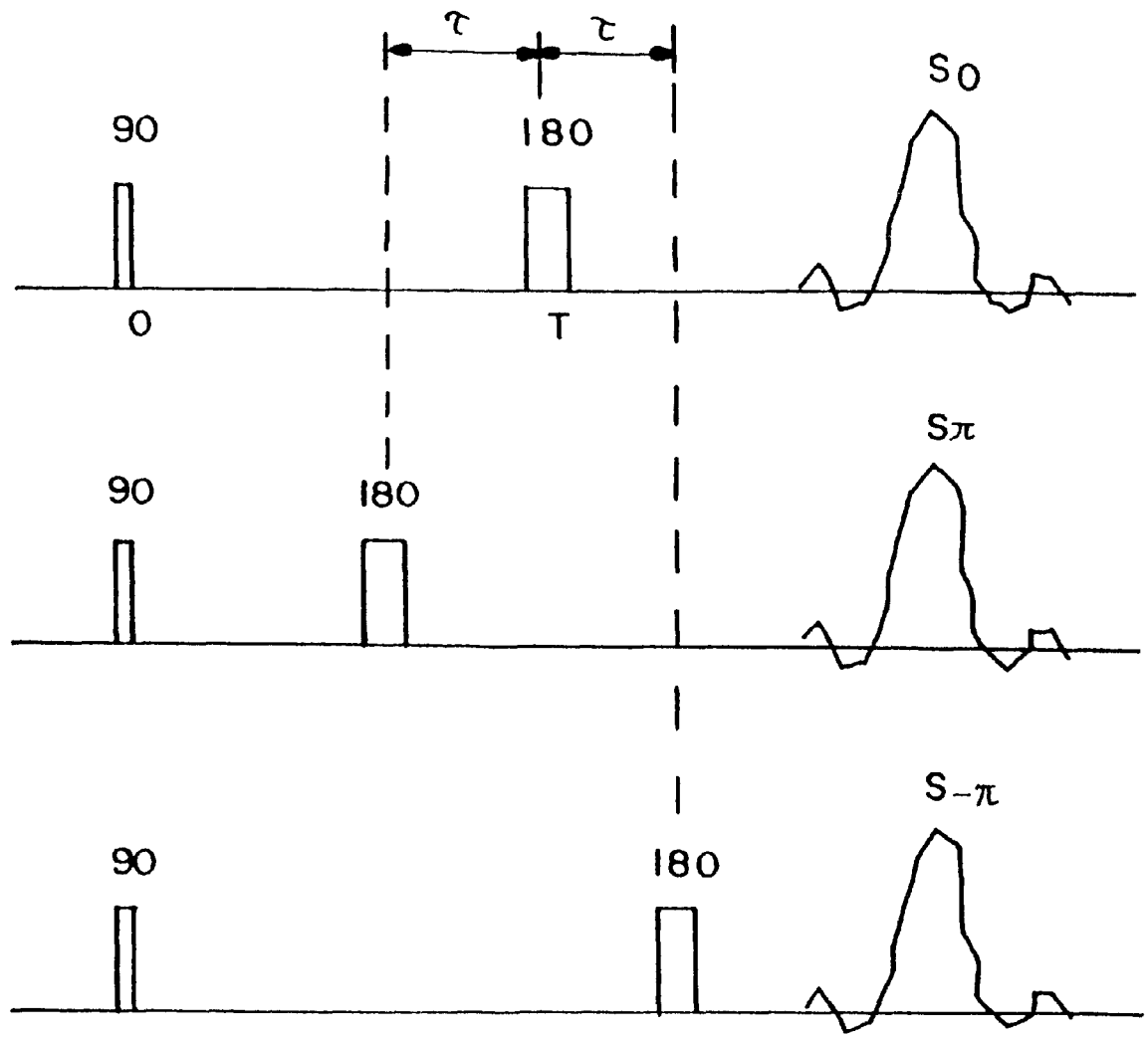
FIG. 2 is a graphical representation in the time domain of a prior art sequencing technique.
Figure 3A:
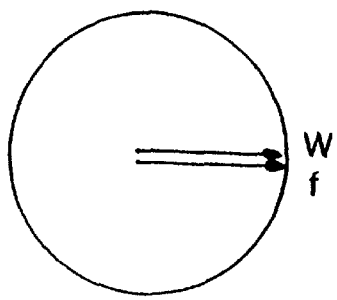
FIGS. 3a–3c are schematic diagrams of rotating frames of the MRI signals of FIG. 2.
Figure 3B:
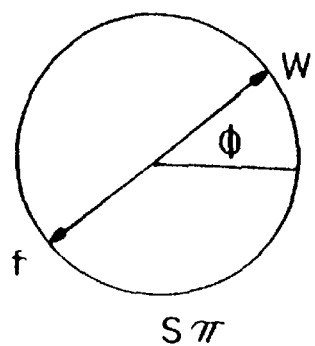
Figure 3C:
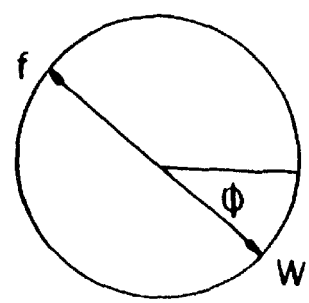
Figure 4:
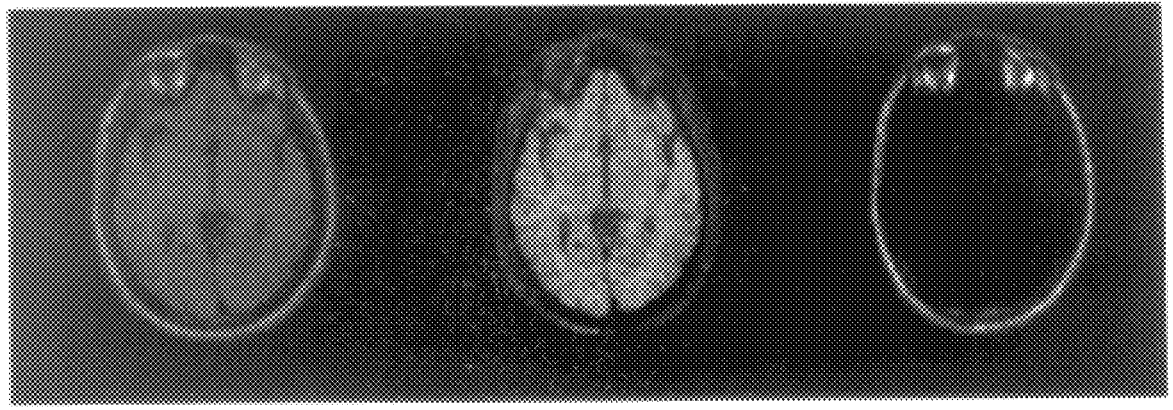
FIG. 4 comprises MRI three-point Dixon head images processed using the binary phase unwraparound algorithm.
Figure 5:
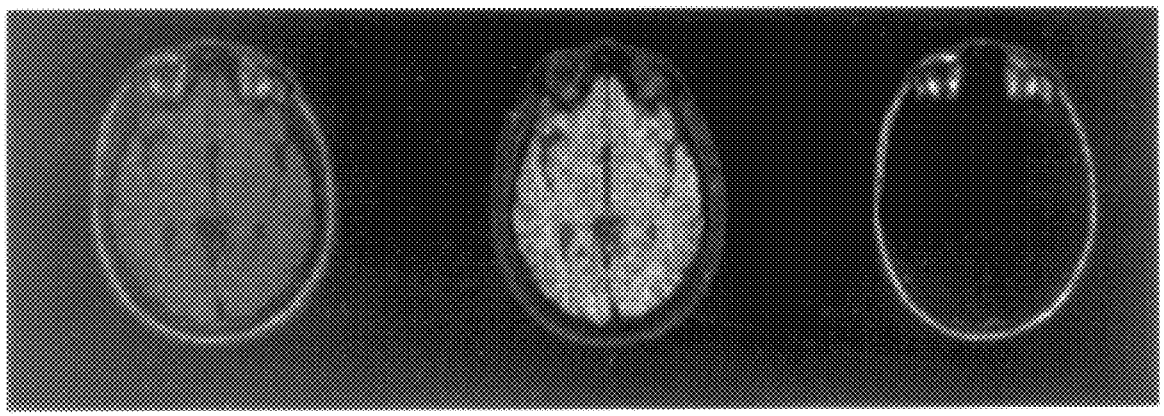
FIG. 5 comprises MRI three-point Dixon head images processed using the region growing algorithm.
Figure 6:
FIG. 6 comprises MRI three-point Dixon abdominal images processed using the binary phase unwraparound algorithm.
Figure 7:
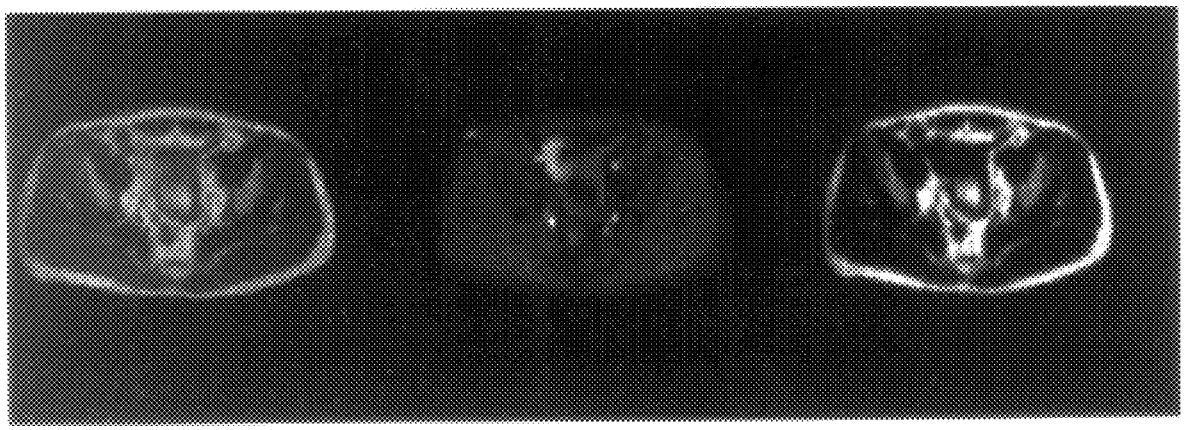
FIG. 7 comprises MRI three-point Dixon abdominal images processed using the region growing algorithm.
Figure 8:
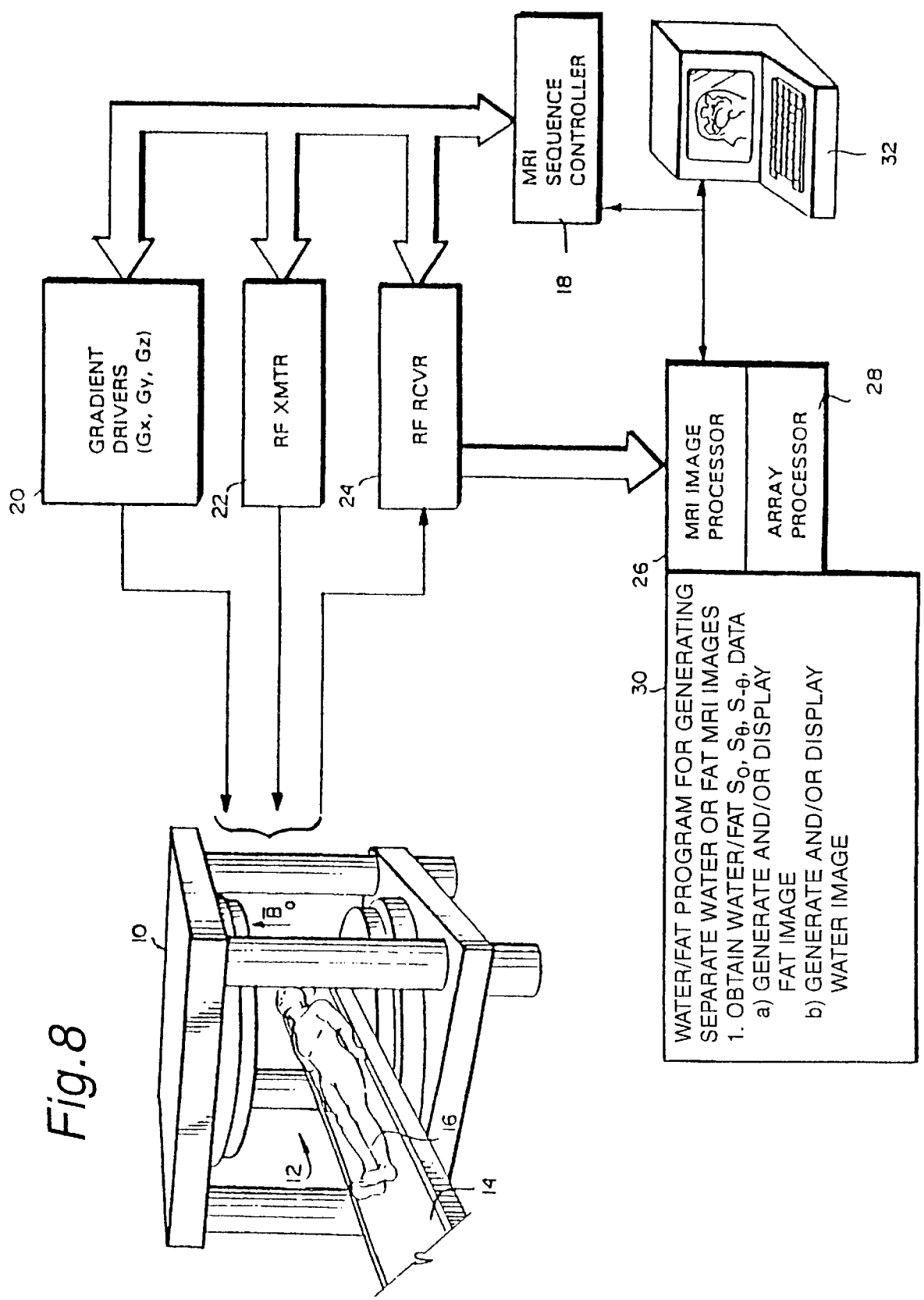
FIG. 8 is a schematic diagram of a conventional MRI system modified so as to practice an exemplary embodiment of this invention.

FIG. 8 depicts a typical convention MRI system that has been adapted so as to practice an exemplary embodiment of this invention. One example of such system is the Toshiba FLEXART™ MRI system. For example, it may comprise a rather large NMR polarizing magnet structure 10 which generates a substantially uniform homogeneous NMR polarizing magnetic field $B_0$ within a patient imaging volume 12. A suitable carriage 14 is used for inserting the desired portion of patient 16 anatomy within the image volume 12. Magnetic NMR gradients in $B_0$ can be selectively created by electromagnetic gradient coils. NMR RF nutation pulses can be transmitted into the patient tissue within the image volume and NMR RF responses can be received from the patient tissue via suitable RF coil structures as will be appreciated by those in the art. A particular MRI data acquisition sequence of such magnetic gradient pulses, RF nutation pulses and NMR RF responses is conventionally achieved by an MRI sequence controller 18 controlling the usual array of gradient drivers 20. RF transmitter circuits 22 and RF receiver circuits 24 all suitably interfaced with electromagnetic and RF coils within the MRI system gantry. The received NMR RF responses are digitized and passed to an MRI image processor 26 which typically includes an array processor 28 and suitable computer program storage media 30 (e.g., RAM in silicon or magnetic media) wherein programs are stored and selectively utilized so as to control the processing of acquired MR image data to produce digitized image displays on the CRT terminal 32. The control terminal 32 may also include suitable keyboard switches and the like for exerting operator control over the MRI sequence controller 18 and the interconnected cooperating MR image processor 26.

In conjunction with the usual MRI processor 26, an operator is typically presented with a menu of choices. In the exemplary embodiment of this invention, one of those choices available to the operator would be a water/fat program for generating separate water or fat MRI images by obtaining the requisite $S_0$, $S_\theta$, $S_{-\theta}$ data and then generating and/or displaying: (a) a fat image, or (b) a water image of the measured NMR nuclei. The generation of a suitable detailed computer program for effecting the described process is believed to be well within the ability of those skilled in this art in view of the disclosure herein.

"Sandwich" Spin-Echo Sequence for Water/Fat Imaging

Figure 9:
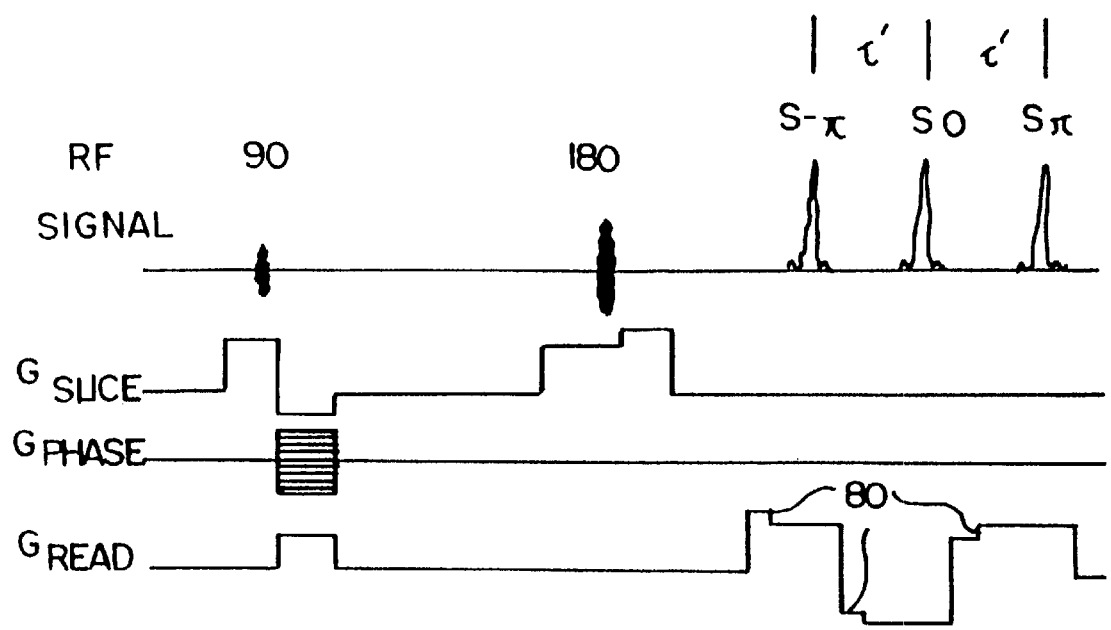
FIG. 9 is a graphical representation in the time domain of a sequencing method according to one embodiment of the present invention.

The basic principle of the Dixon technique for separating water/fat images is the acquisition of separate images with in-phase and out-of-phase water/fat signals, respectively. To obtain these images, the present invention recognizes that at lower field, the time period needed for the spin system to evolve from in-phase to out-of-phase is much longer (e.g., 10.2 ms at 0.35 T vs. 2.4 ms at 1.5 T for a 3.3 ppm chemical shift difference). That is, a 3.3 ppm speed difference between water and fat species at a nominal 15 MHz Lamor frequency (at 0.35 Tesla $B_0$) equals an approximately 50 Hz frequency difference between fat and water NMR species of hydrogen nuclei—which translates to an approximately 20 ms period or about 10 ms for a half revolution of $\pi$ radians (180°) phase shift. As a result, it is possible to acquire a complete k-space data line within this evolution period. FIG. 9 depicts one such exemplary implementation by sandwiching a spin-echo between two field-echoes in a single TR interval.

To obtain the three images in a single scan, a slice along the axis perpendicular to the desired viewing plane is selected for imaging by activating the slice axis gradient coil ($G_{slice}$). Thereafter, a 90° RF transmission signal nutates the selected nuclei 90° (for example) to a position on the Y'-axis. The nuclei in the excited plane are then dephased according to position along the encode-axis by the phase-encode gradient coils ($G_{phase}$).

Later, at a time T following the 90° pulse, a 180° RF transmission nutates the nuclei 180°. This induces a spin echo $S_0$ at a time T following the 180° RF transmission. This spin echo is detected by an RF receiver coil and RF receiver. It can be used as the in-phase $S_0$ data in the Dixon equations.

Between the 90° and 180° RF transmissions, the readout or frequency-encode axis gradient coil imposes a preliminary phase gradient on the nuclei. Then, before the spin echo $S_0$ occurs, the readout axis gradient coil ($G_{read}$) is activated to produce a field echo $S_{-\pi}$ at a time $\tau'$ before the spin echo occurs. This field echo $S_{-\pi}$ is detected by an RF receiver coil and RF receiver. It can be used as $S_{-\pi}$ in the Dixon equations. In essence, since the spin echo $S_0$ will naturally occur at a time duration following the 180° pulse equal to the time duration between the 90° and 180° pulse, the field echo $S_{-\pi}$ can be timed to occur a time amount $\tau'$ before that expected $S_0$ echo.

Before the spin echo $S_0$ occurs, the readout axis gradient coil current is inverted. Then, after the spin echo $S_0$, the readout axis gradient coil current is again inverted to produce a second field echo $S_\pi$ at a time $\tau'$ after the spin echo $S_0$. This field echo $S_\pi$ is also detected and used in the Dixon equations.

The time $\tau'$ is determined in accordance with $\tau'=1/2(\Delta\upsilon)$ as described below. The field echoes are timed to the value of $\tau'$ by bump adjustments 80 as shown at the leading edges of the $G_{read}$ signal. The height (or depth) and width of the bump adjustment in the $G_{read}$ signal will move the resultant $S_{-\pi}$ and $S_\pi$ echoes relative to the $S_0$ echo so the field echoes can be timed to $+\tau'$ and $-\tau'$, respectively, from the spin echo $S_0$ occurrence. The bump adjustments are set based on normal calibration parameters, and will be affected by such things as the gradient power amplifier slew rate, etc.

With values for $S_{-\pi}$, $S_0$, and $S_\pi$ in the Dixon equations, $I_{water}$ and $I_{fat}$ can be determined according to the methods described above in the section entitled "Background of the Invention."

In particular, the value of $\tau'$ was determined according to $$\tau' = \frac{1}{2\Delta\nu}$$

with $\Delta\upsilon$ being the frequency separation of the water and fat signals.

The MRI sequence depicted in FIG. 9 was implemented on a Toshiba 0.35 T system, and both phantom and human head images were acquired. Data processing procedures involved for separating water/fat images were as described in the Background section and in Magnetic Resonance in Medicine, 18; 371–383 (1991).

In some embodiments, there may still be time in the sequence for acquiring more k-space data, e.g., by acquiring several field-echoes before the 180° refocusing pulse. This will be a useful feature of the sequence for separating multiple components such as water-fat-silicone.

The proposed sequence is fully capable of 3-D multiple-slice multiple-echo acquisition. However, the gradients need to be carefully balanced so that echo signals are correctly positioned corresponding to full refocusing of the field inhomogeneities in $S_0$. This technique is compatible with many multi echo, multi scanning methods, such as that described in "*RARE Imaging: A Fast Imaging Method For Clinical MR,*" Henning, et al., Magn. Reson. Med. 1986; 3: 823–833.

In addition, image distortion due to field inhomogeneities is different between the middle echo and the outside echoes due to the inversion of the read gradient. When this becomes a problem for separation of water and fat images, the field inhomogeneity map produced for water/fat separation can also be used to correct the distortion. This is described in Sumanaweera, et al., IEEE Transc. Med. Imag. 12, 251 (1993), which is incorporated herein by reference. Another solution is to only readout the echoes with the readout gradient in one polarity and force the tuning bumps (80) to be of large and opposing polarity.

The invention is not limited to low-field or mid-field systems nor to the exact sequencing shown in FIG. 9, but may be used in any system in which the T2 relaxation time permits the sandwiching of a spin echo by two field echoes—or any other sequence of 3 NMR RF responses providing the requisite water/fat separation data in a single acquisition sequence. Of course, as noted above, 3-D sequences and other than 180° water/fat phase angles may be used.

The three-point Dixon method for water-fat imaging may be embedded into a hybrid RARE type sequence of mixed spin echoes and gradient echoes, using the gradient echoes to encode the chemical shift information, thus combining the speed of the hybrid sequence with the richer, separated water and fat images of Dixon.

An 8×3 hybrid CPMG sequence generates 8 sets of 3 echoes each, by gradient reversals within each pulse interval, for a total of 24 echoes per excitation. Member echoes within each triplet receive the same phase encoding, thus any phase encode scheme good for 8×1 is good here. Spacing between the spin echo and gradient echoes is 9 msec, to give a desired Dixon angle of 240°. The interval between 180° pulses is 35.6 msec. At a TR of 4 sec and TE of 40 msec, 256×256 matrix, 32 excitations, plus one prepulse and one reference shot, generates data of 12 slices, 3 subimages per slice, in 2 minutes 16 seconds. The reference shot is acquired with read gradient and no phase encoding, producing one reference line per echo, which contains sufficient information for echo alignment and for various data corrections during pre-processing of the raw data. All experiments are performed on a Toshiba FlexArt 0.5T whole body system.

After all 24 echoes are centered properly, and phase corrected based on the reference data, data is Fourier transformed. At each spatial point, the image data $I_0$, $I_1$, and $I_2$ should satisfy the following equations:

$$I_0 = (H + Le^{-i\alpha})e^{-i\psi}$$

$$I_1 = H + L$$

$$I_2 = (H + Le^{i\alpha})e^{i\psi}$$

where H and L are water and lipid densities, respectively, $\alpha$ is the Dixon angle, and $\psi$ is the phase shift due to local field inhomogeneities. Line drawings of typical phases of the three images conform closely with the equations. It is seen that the shim error is predominantly quadratic. Once the data has been massaged into this form, then as far as the phase is concerned, the hybrid nature of the data is no longer visible. Further processing can follow a variety of published algorithms for water and fat extraction.

Embedding the Dixon water-fat imaging method into a hybrid fast sequence improves the imaging speed of the useful technique significantly. Alternatively, reduced imaging time also means that more sophisticated variations of the technique, which may be too time-consuming before, may become practical now.

Figure 10:
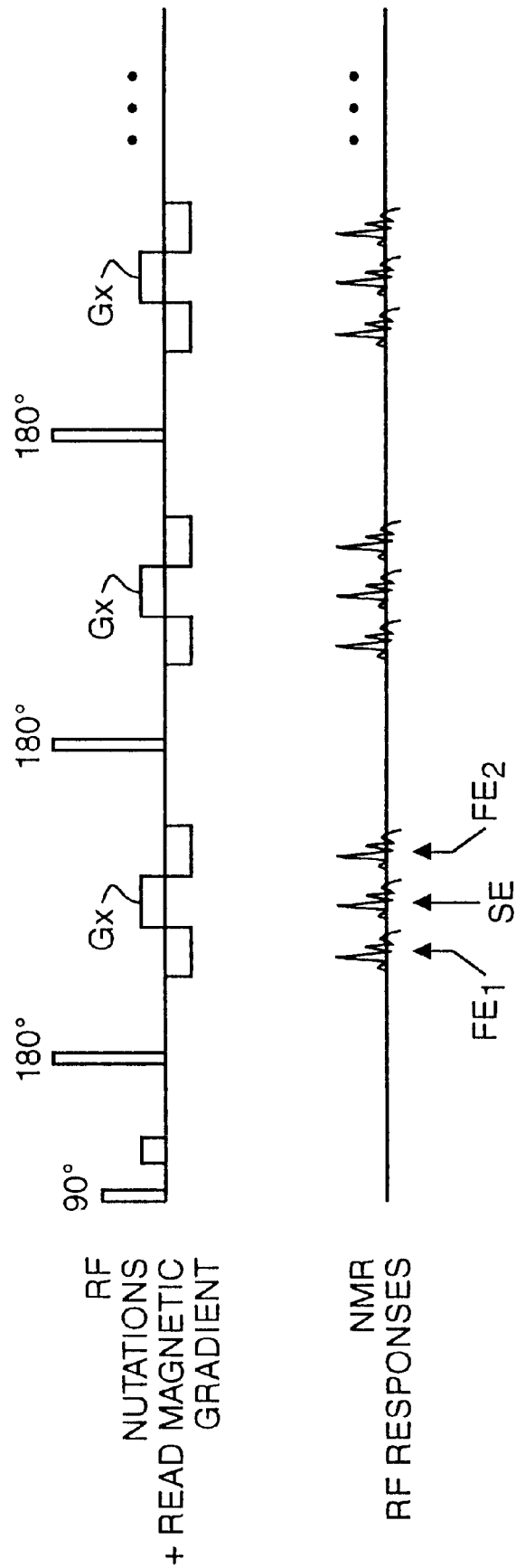
FIG. 10 is a graphical representation in the time domain of another hybrid sequence according to another embodiment of this invention.

To differentiate two chemical components in the imaged region (typically water and fat) in addition to morphological imaging, this exemplary embodiment of the invention may use additional gradient echoes placed about each spin echo of a long train of 180° RF nutation pulses, the so-called hybrid sequence as shown in FIG. 10 and thereby gain a large speed advantage.

Two field echoes (FE) are created in FIG. 10 by reversing the read gradient $G_x$ at approximate times. FE's carry information of chemical shifts, in addition to spatial information. Each triple of echoes within the same 180° nutation pulse interval receive the same spatial encoding. During processing, all FE1's combine into one image, all SE's into one image, and FE2's into a third one. By standard reconstruction algorithms, the three sub-images can then be manipulated to give a separate water image and fat image. A version using 5 echoes (or more) is also straightforward. There is further advantage of speed, robustness, etc.

The choice for the Dixon angle (or equivalently the time interval spacing between consecutive field echoes within one cluster of echoes) depends partly on the reconstruction algorithm. Some algorithms work better with a Dixon angle of $\pi$, other allow other values.

As those in the art will appreciate, there are numerous RF nutation pulse sequences other than the nominal 90°–180° spin-echo/gradient field echo sequences depicted in the exemplary embodiments. The invention can be used generally with 3-D imaging and/or with field echo imaging. As previously mentioned, Dixon phase angles other than $\pi$ radians (180°) are also possible.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of obtaining separated MR images of fat-based NMR nuclei and water-based NMR nuclei, said method comprising the steps of:

1) magnetically aligning the nuclei in a first direction by a static magnetic field;

2) imposing a slice-select gradient on the nuclei to select a planar slice for imaging;

3) nutating the nuclei by a first RF transmission signal;

4) removing the first RF transmission signal and slice-select gradient;

5) imposing a phase distribution with a phase-encode and a readout gradient field pulse on the selected nuclei;

6) nutating the nuclei by a second RF transmission signal to induce a spin echo;

7) before the spin echo, imposing a read gradient on the selected nuclei to induce a first field echo at a time τ' before the spin echo and receiving the first field echo in a first data matrix;

8) after the first field echo, imposing an inverted read gradient on the selected nuclei to read out the spin echo in a second data matrix;

9) after the spin echo, again reversing the read gradient on the selected nuclei to induce a second field echo at a time τ' after the spin echo and receiving the second field echo in a third data matrix;

10) repeating steps 2–9 with various phase encoding gradient pulses to acquire complete spatial data for an encode direction; and 11) processing said spatial data to generate separated MR images of water and fat, said processing step further comprising the substeps of:

11A) Fourier transforming said spatial data to yield first, second and third images;

11B) generating a phase image from said first image and said second image;

11C) phase-unwrapping said phase image with a guided region-growing algorithm;

11D) phase-correcting said first, said second, and said third images in accordance to said unwrapped phase image;

11E) generating water-only and fat-only MR images from said phase-corrected images.

2. A method as in claim 1, wherein the first RF transmission is a nominal 90° nutation pulse and the second RF transmission is a nominal 180° nutation pulse.

3. A method as in claim 1, wherein the slice-select gradient, readout gradient and the phase-encode gradient directions are mutually perpendicular.

4. A method as in claim 1, further comprising the step (after step 10) of, before imposing another nutating first RF transmission signal, again nutating the nuclei with an additional second RF transmission to induce additional spin echos and then repeating steps 7–9 for each additional second RF transmission.

5. A method as in claim 4, further comprising the use of additional phase-encode axis pulses for each set of spin echo plus two field echoes to reduce total scan time.

6. A method as in claim 1, wherein the slice-select gradient in step 2 excites a group of slices and further comprises phase encoding in the slice direction during or after step 5 but before step 7 and repeating all of the steps 2–10 a plurality of times to acquire spatial data for the slice encoding direction.

7. A method of obtaining separated MR images of fat-based NMR nuclei and water-based NMR nuclei, said method comprising the steps of:
   1) magnetically aligning the nuclei in a first direction by a static magnetic field;
   2) imposing a slice-select gradient on the nuclei to select a planar slice for imaging;
   3) nutating the nuclei by a first RF transmission signal;
   4) removing the first RF transmission signal and slice-select gradient;
   5) imposing a phase distribution with a phase-encode and a readout gradient field pulse on the selected nuclei;
   6) imposing a read gradient on the selected nuclei to induce a first field echo at a time τ' before the second field echo and receiving the first field echo in a first data matrix;
   7) after the first field echo, imposing an inverted read gradient on the selected nuclei to induce a second field echo and receiving the second field echo in a second data matrix;
   8) after the second field echo, again reversing the read gradient on the selected nuclei to induce a third field echo at a time τ' after the second field echo and receiving the third field echo in a third data matrix;
   9) repeating steps 2–8 with various phase-encoding gradient pulses to acquire the spatial data for the phase encoding direction; and
   10) processing said spatial data to generate separated MR images of water and fat said processing step further comprising the substeps of:
      10A) Fourier transforming said spatial data to yield first, second and third images;
      10B) generating a phase image from said first image and said second image;
      10C) phase-unwrapping said phase image with a guided region-growing algorithm;
      10D) phase-correcting said first, said second, and said third images in accordance to said unwrapped phase image;
      10E) generating water-only and fat-only MR images from said phase-corrected images.

8. A method as in claim 7 wherein the slice-select gradient in step 2 excites a group of slices and further comprises phase-encoding in the slice direction during or after step 5 but before step 6 and repeating all of the steps 2–9 a plurality of times to acquire spatial data for the slice encoding direction.

9. Apparatus for obtaining separated MR images of fat-based NMR nuclei and water-based NMR nuclei, said apparatus comprising:
   1) means for magnetically aligning the nuclei in a first direction by a static magnetic field;
   2) means for imposing a slice-select gradient on the nuclei to select a planar slice for imaging;
   3) means for nutating the nuclei by a first RF transmission signal;
   4) means for removing the first RF transmission signal and slice-select gradient;
   5) means for imposing a phase distribution with a phase-encode and a readout gradient field pulse on the selected nuclei;
   6) means for nutating the nuclei by a second RF transmission signal to induce a spin echo;
   7) means for before the spin echo, imposing a read gradient on the selected nuclei to induce a first field echo at a time τ' before the spin echo and receiving the first field echo in a first data matrix;
   8) means for, after the first field echo, imposing an inverted read gradient on the selected nuclei to read out the spin echo in a second data matrix;
   9) means for, after the spin echo, again reversing the read gradient on the selected nuclei to induce a second field echo at a time τ' after the spin echo and receiving the second field echo in a third data matrix;
   10) means for repeatedly operating means 2–9 with various phase encoding gradient pulses to acquire complete spatial data for an encode direction; and
   11) means for processing said spatial data to generate separated MR images of water and fat, said processing means further comprising:
      11A) means for Fourier transforming said spatial data to yield first, second and third images;
      11B) means for generating a phase image from said first image and said second image;
      11C) means for phase-unwrapping said phase image with a guided region-growing algorithm;
      11D) means for phase-correcting said first, said second, and said third images in accordance to said unwrapped phase image;
      11E) means for generating water-only and fat-only MR images from said phase-corrected images.

10. Apparatus as in claim 9, wherein the first RF transmission is a nominal 90° nutation pulse and the second RF transmission is a nominal 180° nutation pulse.

11. Apparatus as in claim 9, wherein the slice-select gradient, readout gradient and the phase-encode gradient directions are mutually perpendicular.

12. Apparatus as in claim 9, further comprising means for, before imposing another nutating first RF transmission signal, after operation of means 10, again nutating the nuclei with an additional second RF transmission to induce additional spin echos and then repeatedly operating means 7–9 for each additional second RF transmission.

13. Apparatus as in claim 12, further comprising means for using additional phase-encode axis pulses for each set of spin echo plus two field echoes to reduce total scan time.

14. Apparatus as in claim 9, wherein the slice-select gradient imposed by means 2 excites a group of slices and further comprises means for phase-encoding in the slice direction during or after operation of means 5 but before means 7 and repeating operation of all means 2–10 a plurality of times to acquire spatial data for the slice encoding direction.

15. Apparatus for obtaining separated MR images of fat-based NMR nuclei and water-based NMR nuclei, said apparatus comprising the steps of:
1) means for magnetically aligning the nuclei in a first direction by a static magnetic field;
2) means for imposing a slice-select gradient on the nuclei to select a planar slice for imaging;
3) means for nutating the nuclei by a first RF transmission signal;
4) means for removing the first RF transmission signal and slice-select gradient;
5) means for imposing a phase distribution with a phase-encode and a readout gradient field pulse on the selected nuclei;
6) means for imposing a read gradient on the selected nuclei to induce a first field echo at a time $\tau'$ before the second field echo and receiving the first field echo in a first data matrix;
7) means for, after the first field echo, imposing an inverted read gradient on the selected nuclei to induce a second field echo at a time when the signals from the fat-based and water-based nuclei and receiving the second field echo in a second data matrix;
8) means for, after the second field echo, again reversing the read gradient on the selected nuclei to induce a third field echo at a time $\tau'$ after the second field echo and receiving the third field echo in a third data matrix;
9) means for repeatedly operating means 2–8 with various phase-encoding gradient pulses to acquire the spatial data for the phase encoding direction; and
10) means for processing said spatial data to generate separated MR images of water and fat, said processing means further comprising:
    10A) means for Fourier transforming said spatial data to yield first, second and third images;
    10B) means for generating a phase image from said first image and said second image;
    10C) means for phase-unwrapping said phase image with a guided region-growing algorithm;
    10D) means for phase-correcting said first, said second, and said third images in accordance to said unwrapped phase image;
    10E) means for generating water-only and fat-only MR images from said phase-corrected images.

16. Apparatus as in claim 15 wherein the slice-select gradient generated by means 2 excites a group of slices and further comprises means for phase-encoding in the slice direction during or after operation of means 5 but before operation of means 6 and repeating operation of all of the means 2–9 a plurality of times to acquire spatial data for the slice encoding direction.

17. A method for generating in a single scan separate images for first and second NMR species of nuclei, said method comprising the steps of:
initiating an MRI sequence TR interval for a region to be imaged having both said species of nuclei with at least one RF nutation pulse and associated magnetic fields being applied to said region;
obtaining successive first, second and third NMR RF responses during said TR interval, said first and third responses being spaced in time from the second response by predetermined equal intervals corresponding to predetermined oppositely-directed phase differences between the NMR species;
repeating a multiplicity of said TR intervals with various phase-encoding gradient pulses to complete the spatial data; and
processing the thus-acquired first, second and third NMR RF responses to produce separate images of said first and second NMR species.

18. A method as in claim 17 wherein said method is incorporated in a two-dimensional MRI data acquisition sequence having one dimension of spatial phase-encoding within a selected slice of said region.

19. A method as in claim 17 wherein said method is incorporated in a three-dimensional MRI data acquisition sequence having two dimensions of spatial phase-encoding within a multi-slice volume of said region.

20. A method as in claim 17 wherein said first and third NMR RF responses are caused to occur at times when the net magnetic spin of said first and second NMR species are approximately plus 180° and minus 180° out-of-phase with respect to one another.

21. A method as in claim 17 wherein said second NMR response is a spin echo and said first and third NMR responses are field echos.

22. A method as in claim 17 wherein said first, second and third NMR responses are all field echos.

23. Apparatus for generating in a single scan separate images for first and second NMR species of nuclei, said apparatus comprising:
means for initiating an MRI sequence TR interval for a region to be imaged having both said species of nuclei with at least one RF nutation pulse and associated magnetic fields being applied to said region;
means for obtaining successive first, second and third NMR RF responses during said TR interval, said first and third responses being spaced in time from the second response by predetermined equal intervals corresponding to predetermined oppositely-directed phase differences between the NMR species;
means for repeating a multiplicity of said TR intervals with various phase-encoding gradient pulses to complete the spatial data; and
means for processing the thus-acquired first, second and third NMR RF responses to produce separate images of said first and second NMR species.

24. Apparatus as in claim 23, wherein said MRI sequence is a two-dimensional MRI data acquisition sequence having one dimension of spatial phase-encoded within a selected slice of said region.

25. Apparatus as in claim 23 wherein said MRI sequence is a three-dimensional MRI data acquisition sequence having two dimensions of spatial phase-encoding within a multi-slice volume of said region.

26. Apparatus as in claim 23 wherein said first and third NMR RF responses are caused to occur at times when the net magnetic spin of said first and second NMR species are approximately plus 180° and minus 180° out-of-phase with respect to one another.

27. Apparatus as in claim 23, wherein said second NMR response is a spin echo and said first and third NMR responses are field echoes.

28. Apparatus as in claim 23, wherein said first, second and third NMR responses are all field echoes.

* * * * *